(12) United States Patent
Jalanti et al.

(10) Patent No.: US 6,345,429 B1
(45) Date of Patent: Feb. 12, 2002

(54) METHOD FOR FASTENING OBJECTS FLUSH TO A SURFACE

(75) Inventors: David J. Jalanti, Hudson; Edward Furey, Kingston, both of NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/478,314

(22) Filed: Jan. 6, 2000

(51) Int. Cl.⁷ ............................................... B21D 39/03
(52) U.S. Cl. ........................................ 29/428; 403/353
(58) Field of Search ........................... 29/428; 403/353, 403/381

(56) References Cited

U.S. PATENT DOCUMENTS

| 319,948 | A | | 6/1885 | Bates |
| 677,130 | A | | 6/1901 | Hatfield et al. |
| 1,178,338 | A | * | 4/1916 | Niernsee |
| 3,829,741 | A | * | 8/1974 | Athey ........................ 317/101 |
| 4,932,105 | A | | 6/1990 | Muller |
| 5,193,244 | A | * | 3/1993 | Meyers ....................... 15/235.4 |

\* cited by examiner

*Primary Examiner*—S. Thomas Hughes
*Assistant Examiner*—John C. Hong
(74) *Attorney, Agent, or Firm*—Floyd Gonzalez; Cantor Colburn LLP

(57) ABSTRACT

An exemplary embodiment of the present invention is a method for fastening an object flush to a surface. The method comprises inserting an engagement member of the object into an opening in the planar member. The engagement member moves in a first direction and remains at or below the surface of the planar member. The engagement member of the object is repositioned in the opening while moving in a second direction. An engaging force is then applied to the engagement member in a third direction. The engaging force causes the engagement member of the object to be secured within the opening flush or below the surface of the planar member.

15 Claims, 9 Drawing Sheets

METHOD FOR FASTENING OBJECTS FLUSH TO A SURFACE

TECHNICAL FIELD

The present invention relates to an apparatus and method for fastening and, more particularly, to an apparatus and method for fastening objects flush to a surface.

BACKGROUND OF THE INVENTION

Large networked computer systems require a substantial number of printed circuit cards to perform a countless variety of tasks. The printed circuit cards are typically housed within a plurality of rectangular boxes, which are commonly referred to as a chassis or a main carrier of components. The chassis are then loaded into the system having a cabinet like structure which is configured to receive and support a number of chassis. The chassis are generally inserted laterally and stacked one on top of the other. Each chassis has at least one exposed end where a cable is inserted so that the printed circuit cards can interface, for example, with an SP computer system. The cabinet like structure can also expose two ends of the rectangular chassis so that a cable can connect with, for example, a 390 computer system.

The cabinet like structure provides an area defined only slightly greater in length, width and height than the chassis itself. As a result, the chassis cannot have any protrusions or extensions, such as a screw head or other securement devices, located on its outer surface. A screw head can actually prevent the chassis from properly loading into the structure. Moreover, and if the chassis cannot be inserted into the structure then the computer system cannot interface with the printed circuit cards. Consequently, if the printed circuit cards or components are secured in the chassis, then the securement device must be flush to the outer surface of the chassis.

Other alternatives such as using adhesives, employing screws and even welding are labor intensive and do not provide a convenient removable means for securing printed circuit cards flush to the outer surface of the chassis.

As a result, there is a need for an apparatus and method for fastening objects flush to a surface.

There is also a need for an apparatus and method for fastening a securement member flush to an upper surface of a mounting cover.

There is yet another need for a method and apparatus for fastening a securement member flush to a mounting cover so that a printed circuit card or other component may properly interface with a printed circuit board in a chassis without interfering with the insertion of the chassis into the computer system.

There is also need for an apparatus and method for fastening a securement member flush to an upper surface of a cover mounted to a chassis to ensure the chassis will properly load into its intended structure for use with a computer system.

SUMMARY OF THE INVENTION

An exemplary embodiment of the present invention is an apparatus and method for fastening objects flush to a surface. In particular, the apparatus and method allow a plurality of securement members to be inserted flush into a plurality of openings. The method comprises inserting an engagement member of an object through an opening in a planar member. The insertion of the engagement member causes the object to move in a first direction. The engagement member remains at or below the surface of the planar member. The engagement member of the object is repositioned in the opening. The repositioning causes the engagement member to be moved in a second direction. The second direction is substantially orthogonal to the first direction. An engaging force is applied to a portion of the engagement member. The engaging force is applied in direction substantially opposite to the first direction. The engaging force causes a portion of the engagement member of the object to be secured within the opening.

These and other features and advantages of the present invention will be apparent from the following brief description of the drawings, detailed description, and appended claims and drawings.

BRIEF DESCRIPTION OF THE DRAWINGS

The invention will be further described in connection with the accompanying drawings in which.

DETAILED DESCRIPTION OF THE PREFERRED EMBODIMENTS

Figure 1:
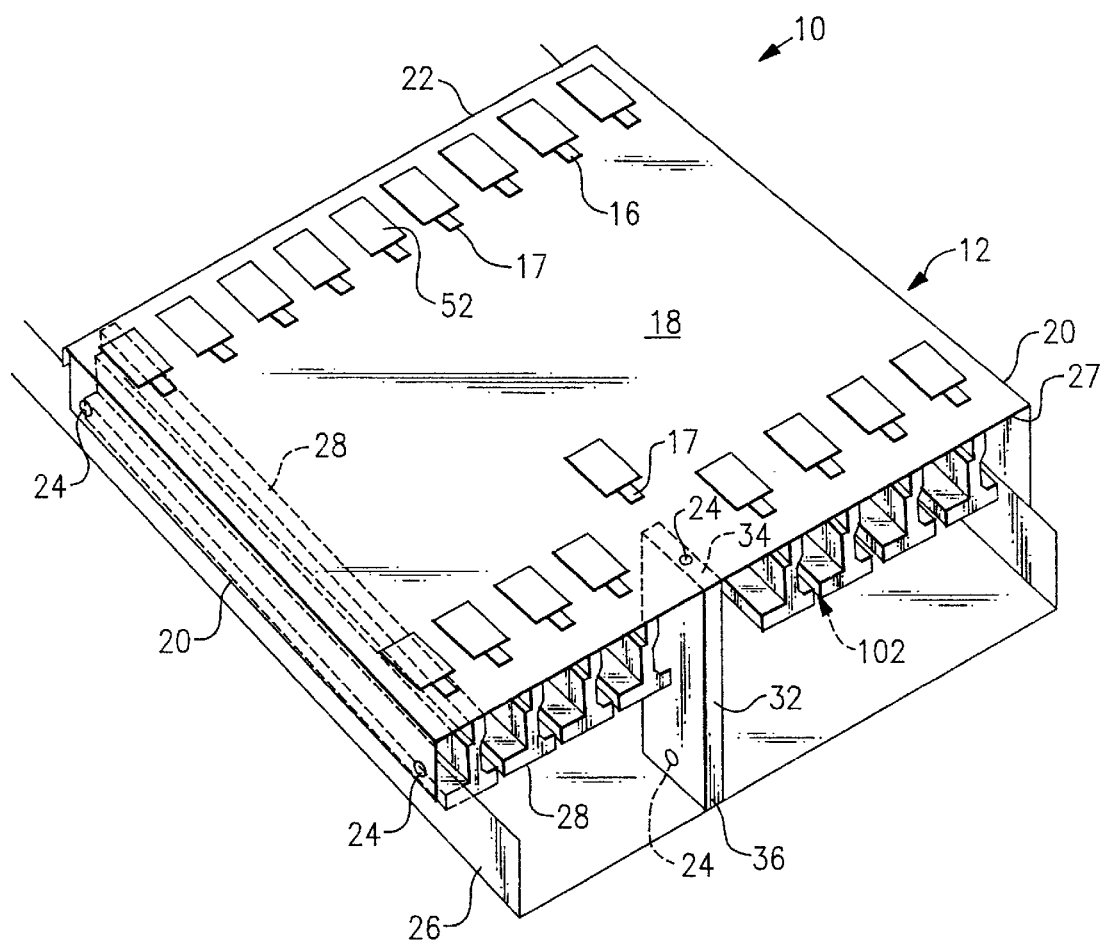
FIG. 1 is a perspective view of the present invention.

Referring now to FIGS. 1–4, a mounting structure 10 constructed in accordance with the present invention is shown. Structure 10 has a mounting cover 12. Cover 12 preferably is constructed out of steel or any other type of sheet metal. Cover 12 has a plurality of retention slots or openings 16 in an upper surface 18. Cover 12 is configured to have a pair of side portions 20 and an end portion 22. Side portions 20 and end portion 22 are positioned to extend downwardly from upper surface 18. Side portions 20 also have a plurality of apertures 24 for mounting cover 12 preferably to a chassis containing a printed circuit board (not shown). Apertures 24 are formed in mounting cover 12 by a two step process and can be generally defined as follows: holes are punched out of cover 12, which displace excess material; then, the hole is struck a second time creating aperture 24 with chamferred sides for receiving screws. This second hit, which creates the chamferred sides of the aperture, is referred to as a countersink. Cover 12 is also configured to have an edge 27.

A partition 32 is configured, dimensioned and positioned to provide additional support to mounting cover 12 (FIG. 1). Partition 32 includes a top portion 34 and a base portion 36 for mounting it to cover 12 at apertures 24 and the chassis, respectively.

Figure 2:
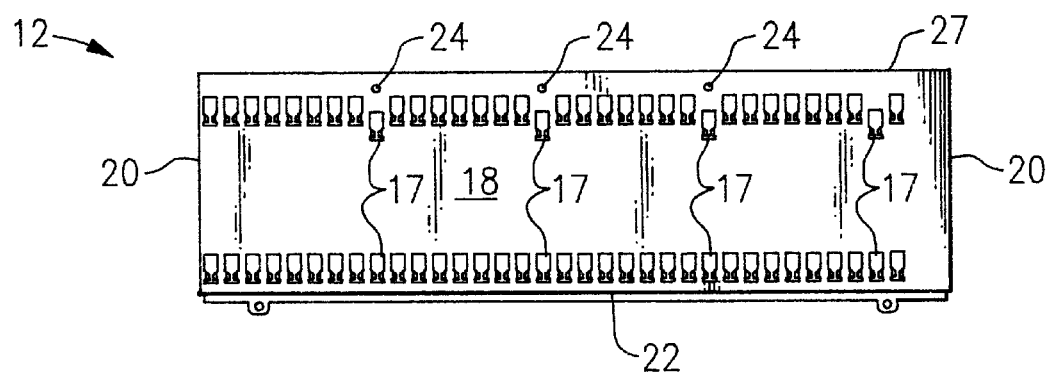
FIG. 2 is an isometric view of the mounting cover.

A pair of openings 17 are positioned and located to accommodate the positioning of partition 32 (FIGS. 1 and 2). Alternatively, partition 32 can be centered underneath cover 12, placed off centered to either the left or right underneath cover 12, and/or placed at the anterior or open end of cover 12 or posterior at end portion 22 of cover 12. Partition 32 can likewise extend the entire length of cover 12 or just a portion of it as required by the dimensions outlined in the engineering documents (drawings, specifications, etc.). Moreover, a plurality of partitions 32 can be used (FIG. 2). Partition 32 is constructed from the same materials as mounting cover 12 as well as other suitable durable materials such as plastics and metal alloys containing steel. Cover 12 can also be configured, dimensioned and positioned, when mounted, to not require partition 32 for support.

Mounting cover 12 can be manufactured from materials such as metals or metal alloys, but preferably steel or an alloy containing steel. Cover 12 can also be scaled in size and thickness to accommodate different geometric configurations. However, the thickness of cover 12 is limited by the stamping process used to create the plurality of openings 16. Mounting cover 12 preferably is approximately 57.3 cm long and approximately 19.5 cm wide; however, cover 12 can be constructed and dimensioned as required by its specific application.

Figure 3:
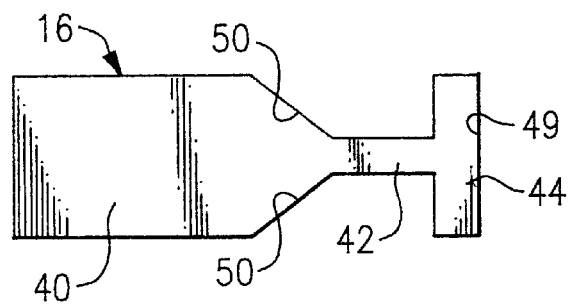
FIG. 3 is an opening of the mounting cover shown in FIG. 2 prior to undergoing the "swaging" process.
Figure 4:
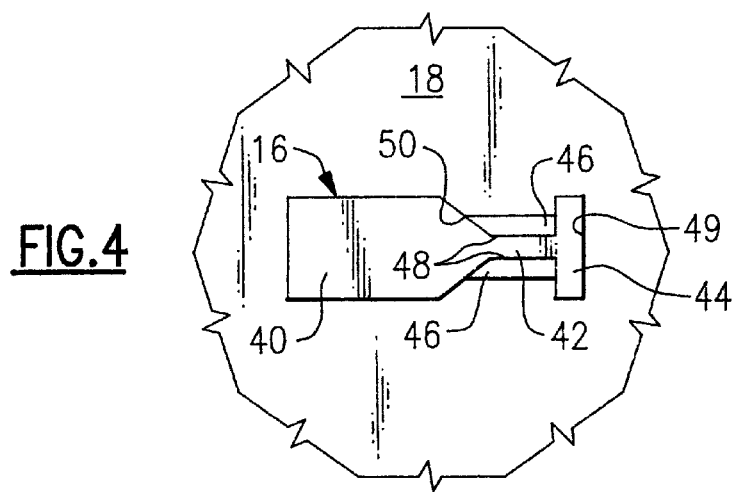
FIG. 4 is an enlarged view of an opening shown in FIGS. 1 and 2 after the "swaging" process.

Referring now to FIGS. 3–4, plurality of openings 16 are formed using a "swaging" process and can be generally defined as follows: a hole having an "H" like configuration is stamped in cover 12 using a device or a manually operated tool (FIG. 3), then the narrow portion of the "H" like configuration is "swaged" or stamped a second time with a device or a manually operated tool to create plurality of openings 16 (FIG. 4). Plurality of openings 16 are adapted to receive a plurality of male fasteners or engagement members 52 of securement members 28. Once engagement members 52 are received within plurality of openings 16, the position of openings 16 cause securement members 28 to be arranged in a uniform manner. Once fully engaged within opening 16, the positioning and configuring of securement members 28 define a plurality of receiving areas 102 (FIG. 1).

Referring now to FIG. 2, in one embodiment plurality of openings 16 are equally spaced from each other and define two rows of openings 16 in upper surface 18 of mounting cover 12 (FIG. 2). Of course, and as contemplated in accordance with the instant application, the location, size and configuration of openings 16 may vary. For example, the configuration of securement members 28, such as the length, width and size of an engagement member 52 or a portion extending from securement member 28, will affect the position of plurality of openings 16. Referring now to FIG. 4, plurality of openings 16 are further defined to each have a receiving opening 40, a second portion or an engagement opening 42, and a first portion or a staking opening 44.

A pair of tab portions 46 extend into openings 16 and are in a facing spaced relationship so as to define engagement opening 42 (FIG. 4). Tab portions are located intermediate receiving opening 40 and staking opening 44. Tab portions 46 are also chamferred so as to have an engagement surface 48. Engagement surface 48 provides a male fastener supporting means within an angular configuration (FIG. 4). Upon insertion of engagement members 52 into openings 16, engagement opening 42 supports engagement members 52 within openings 16.

A portion of receiving opening 40 is defined by a pair of sidewalls 50 in a facing spaced relationship. Pair of sidewalls 50 are positioned to depend angularly inwardly to each other to promote smooth engagement of engagement members 52 within openings 16 as engagement members 52 slide in the direction of arrow 98 as indicated by the dashed lines in FIG. 9. Staking opening 44 includes a back edge 49 or a stop surface that prevents engagement member 52 from sliding any further in the direction of arrow 98. In the exemplary embodiment, opening 16 is approximately 2.8 cm–4.0 cm long. Both receiving opening 40 and staking opening 44 are approximately 0.75 cm (0.30 in.) wide. Engaging opening 42 is approximately 0.264 cm (0.10 in.). However, plurality of openings 16 including receiving opening 40, engaging opening 42 and staking opening 44 again may be scaled in size and configured to receive engagement members 52 of different lengths, widths and shapes.

Figure 5:
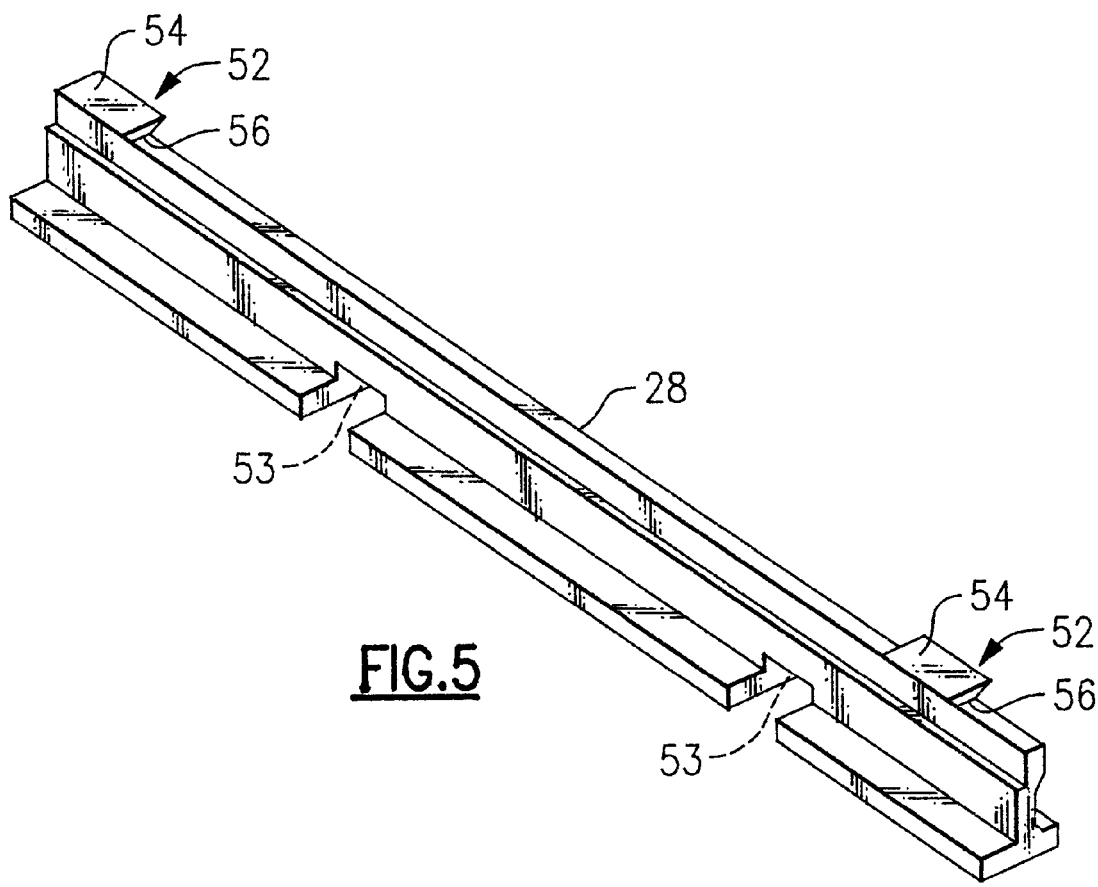
FIG. 5 is a perspective view of a preferred embodiment of a securement member.
Figure 6:
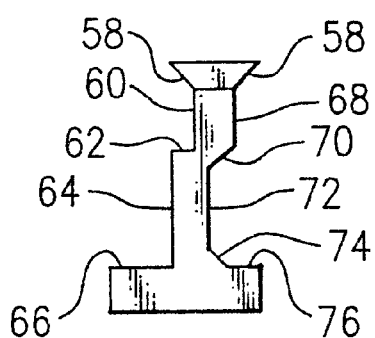
FIG. 6 is an end view of the preferred embodiment of the securement member shown in FIG. 5.
Figure 7:
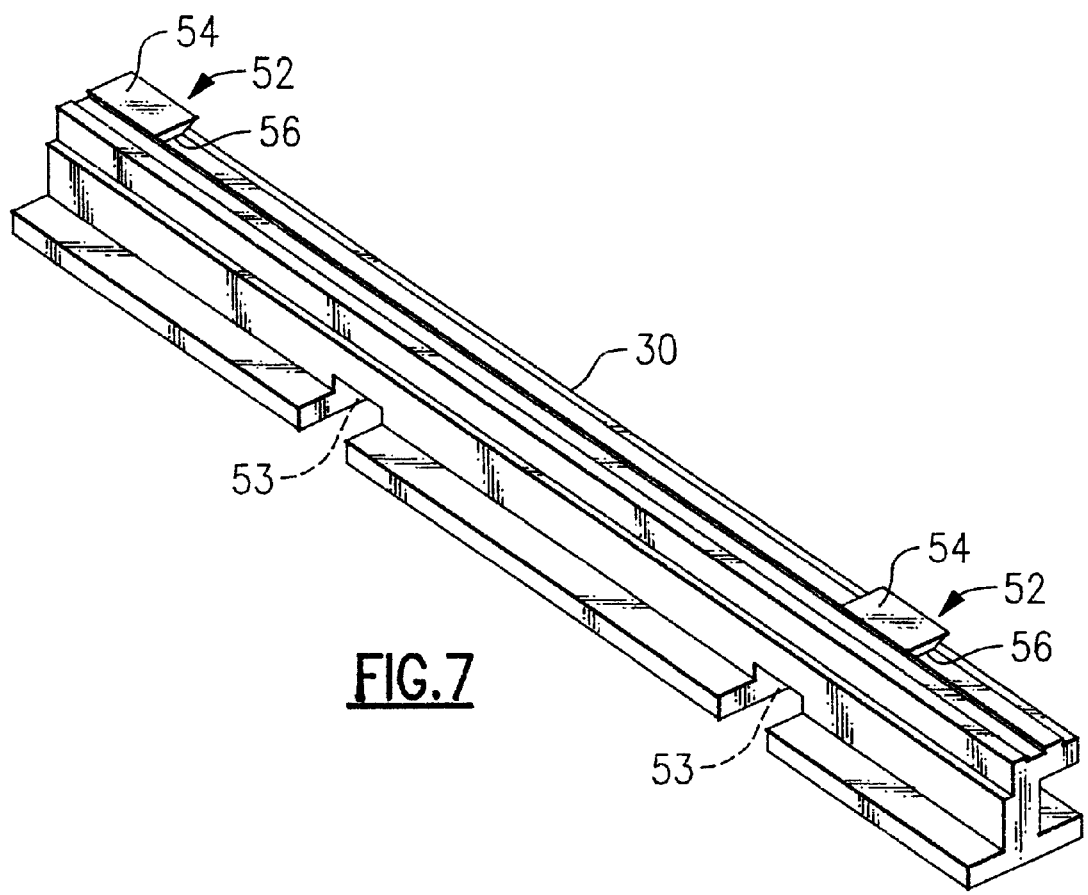
FIG. 7 is a perspective view of a preferred embodiment of a securement member.

Referring now to FIGS. 5–8, securement members 28 as well as securement member 30 each have a pair of engagement members 52, or portions extending from securement members 28 and securement member 30, which are received and engaged by plurality of openings 16. Engagement members 52 can be positioned anywhere along the top of securement members 28 and securement member 30 in accordance with the design specifications required for the desired application. In addition, securement members 28, 30 each have a pair of cut-outs 53. Securement members 26 can be manufactured with as many cut-outs 53 as required (FIGS. 5 and 7). The significance of cut-outs 53 will be discussed further in the specification.

Securement members 28 and securement member 30, and engagement members 52, preferably are constructed from extruded aluminum which possesses malleable qualities, or other metals possessing similar malleable qualities including but not limited combinations or alloys containing aluminum and other malleable metals. Securement members 28 and securement member 30 are first extruded and then undergo secondary machining to create engagement members 52. Engagement members 52 also possess the same malleable qualities of securement members 28 and securement member 30. In the preferred embodiment, engagement members 52 are configured to have a top portion 54 wider than a base portion 56, which are defined by a pair of side portions 58 extending angularly inward (FIGS. 5–8).

In the exemplary embodiment, securement members 28 are approximately 14.5 cm (5.71 in.) long, 0.87 cm (0.34 in.) wide at its base and stands approximately 1.45 cm (0.571 in.) tall. In the exemplary embodiment, securement member 30 is approximately 14.5 cm (5.71 in.) long and approximately 1.47 cm (0.579 in.) wide at its base and stands approximately 1.45 (0.571 in.) cm tall. In the exemplary embodiment, engagement members 52 are approximately 1.00±0.05 cm (0.394+0.02 in.) long and have a width less than the width of both receiving opening 40 and staking opening 44. However, both securement members 28 and securement member 30, as well as engagement members 52, can be constructed in accordance with the design specifications of the desired applications so that the length, width and height of securement members 28 and securement member 30 can vary as well as the length, width and shape of engagement members 52.

Referring now in particular to FIG. 6, securement member 28 has a first sidewall 60 depending downwardly from the top of securement member 28. A longitudinal shoulder 62 is depends outwardly from first sidewall 60. A second sidewall 64 depends downward from longitudinal shoulder 62. A base portion 66 depends outwardly from second sidewall 64. Securement member 28 also has a flanking first sidewall 68 depending downwardly from the top of securement member 28. A first slanted sidewall 70 depends downward and angled inward from flanking first sidewall 68. A flanking second sidewall 72 depends downwardly from first slanted sidewall 70. A second slanted sidewall 74 depends outwardly and angled from flanking second sidewall 72. A flanking base portion 76 depends outwardly from second slanted sidewall 74.

Figure 8:
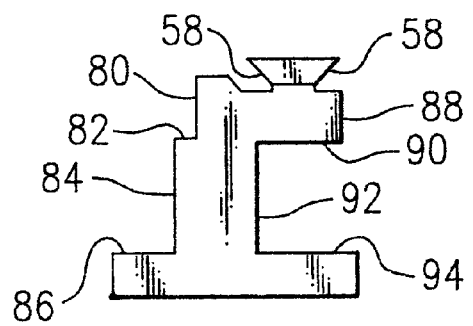
FIG. 8 is an end view of the preferred embodiment of the securement member shown in FIG. 7.

Referring now in particular to FIG. 8, securement member 30 has a first sidewall 80 depending outwardly from the top of securement member 30. A longitudinal shoulder 82 depends outwardly from first sidewall 80. A second sidewall 84 depends outwardly from longitudinal shoulder 82. A base portion 86 depends outwardly from second sidewall 84. A flanking first sidewall 88 depends downwardly from the top of securement member 30. A ceiling 90 depends inwardly from flanking first sidewall 88. A flanking second sidewall 92 depends downwardly from ceiling 90. A base portion 94 depends outwardly from flanking second sidewall 92. Securement member 30 is configured to accommodate the position of partition 32 as well as define a portion of receiving area 104.

Figure 9:
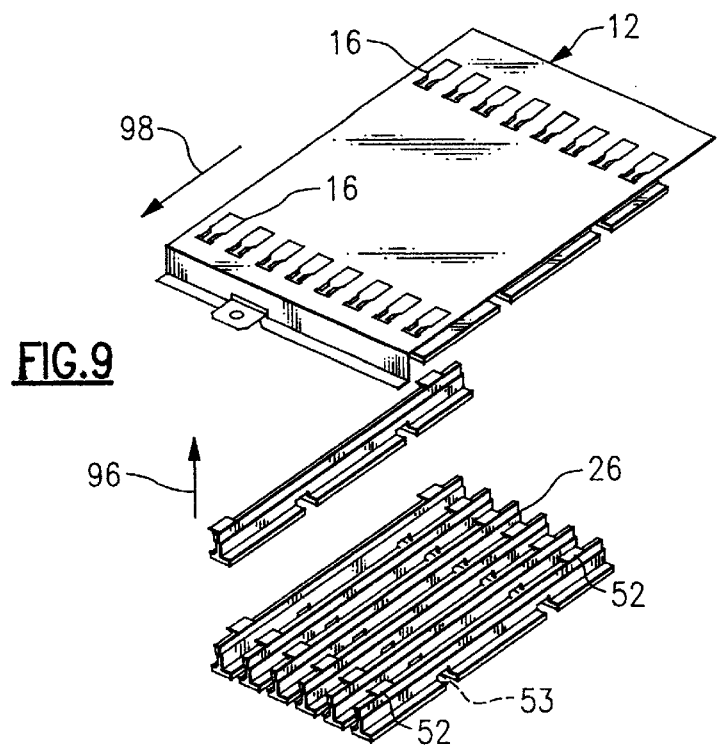
FIG. 9 is a perspective view of the securement members in FIGS. 5–6 mating with the mounting cover.

Referring now to FIG. 9, engagement members 52 are first inserted through receiving openings 40 in a first direction shown by an arrow 96. During the insertion of engagement members 52, top portion 54 does not rise above upper surface 18 of mounting cover 12. Top portion 54 of engagement members 52 remain level with upper surface 18 of mounting cover 12. Securement members 28 are then repositioned in a second direction indicated by an arrow 98 so that engagement members 52 are now positioned within engagement opening 42 and staking area 44. Engagement surfaces 48 make contact with and positively grip the side portions 58 of engagement members 52 as securement members 28 slidably engage engagement openings 40 in the second direction shown by arrow 98. The positioning and configuration of side portions 58 and engagement surfaces 48 keep engagement member 52 at or below upper surface 18. Once engagement members 52 are repositioned, top portions 54 are always level with upper surface 18 of cover 12.

Figure 10:
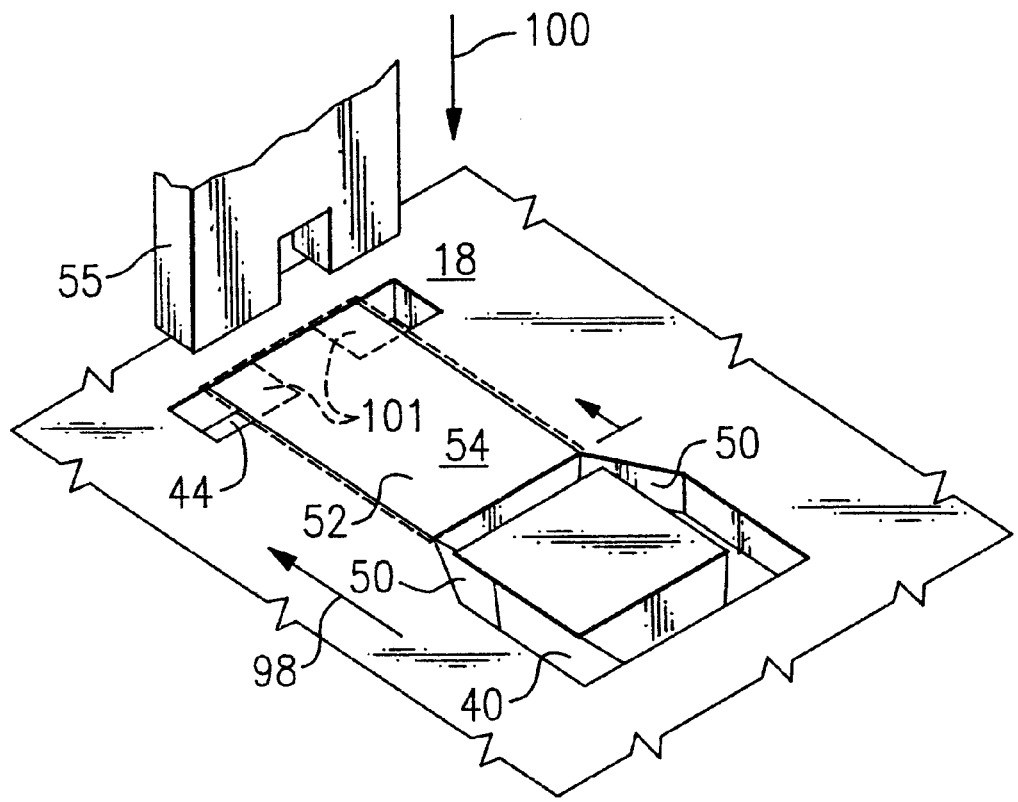
FIG. 10 is an expanded view of an engagement member inserted into an opening as shown in FIG. 8.
Figure 11:
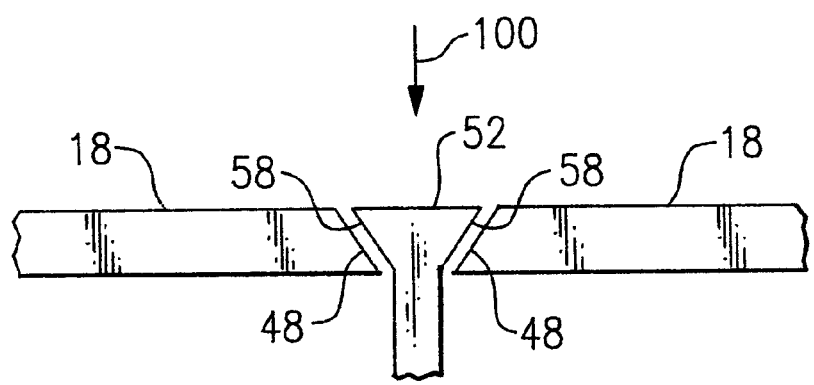
FIG. 11 is a perspective view from 10—10 of the engagement member mating with the opening.

Referring now to FIGS. 10–11, once engagement members 52 are positively gripped by engaging opening 42, engagement members 52 now rest in engaging opening 42 and staking opening 44. A downward force is applied in a direction depicted by an arrow 100 to areas 101 of each top portion 54 of engagement members 52. An apparatus or a device such as a press equipped with a hammer, or a person using a hammer, applies the downward force as illustrated by a hammer 55 in FIG. 10. The hammer is configured to strike areas 101 and can resemble a split fork with two separate and distinct striking surfaces as shown in FIG. 10. When applied, such a pair of striking surfaces simultaneously strike upper surface 54 of engagement members 52 and deflect the malleable material of engagement member 52 at areas 101.

As engagement member 52 is forced downward in the direction of arrow 100, a portion of engagement member 52 is forced into portions of staking opening 44 (FIGS. 10–11). Staking opening 44 possesses a width larger than the width of engaging members 52. Prior to engaging members 52 being forced downward into staking opening 44, an open space or unoccupied portion exists on either side of that part of engagement member 52 within staking opening 44 (FIGS. 10–11).

As areas 101 of engaging member 52 are forced downwardly, portions of engagement member 52 remain supported by engaging surfaces 48 of engaging opening 42 (FIGS. 10–11). However, the part of engagement member 52 located in staking opening 44 and without engagement surfaces 48 for support are forced into the open or unoccupied portions of staking opening 44 (FIG. 4). Once engagement members 52 are forced into staking area 44, engagement members 52, securement members 28, and securement member 30 are all prevented from being repositioned again. Accordingly, engagement members 52 are now fastened flush to cover 12.

Fastening engaging members 52 to cover 12 in this manner is referred to as a self-fixturing method. Typically, before two parts can be joined, a separate tool is specifically designed and implemented to hold each part in place. Once the two parts have been secured, fastened, adhered, etc. together by another device or tool, the separate tool designed to hold the parts in place is removed. This process is referred to as fixturing.

In the present invention, a separate tool is not required to hold securement members 28 or securement member 30 in place within mounting cover 12 prior to applying the engaging force in the direction of arrow 100; thus, the method is referred to as self-fixturing. Once engagement members 52 slidably engage opening 16 and engagement opening 42 positively support sidewalls 58 of engagement members 52, securement members 28 remain in place within mounting cover 12. Securement members 28 do not require further alignment or a separate tool to hold them in place within mounting cover 12 prior to applying the engaging force in the direction of arrow 100. As a result, the method for inserting securement members 28 into openings 16 is a self-fixturing process. Additional benefits, such as time and cost efficient and not as labor intensive, are realized since designing, manufacturing and using a special tool is not required.

Figure 12:
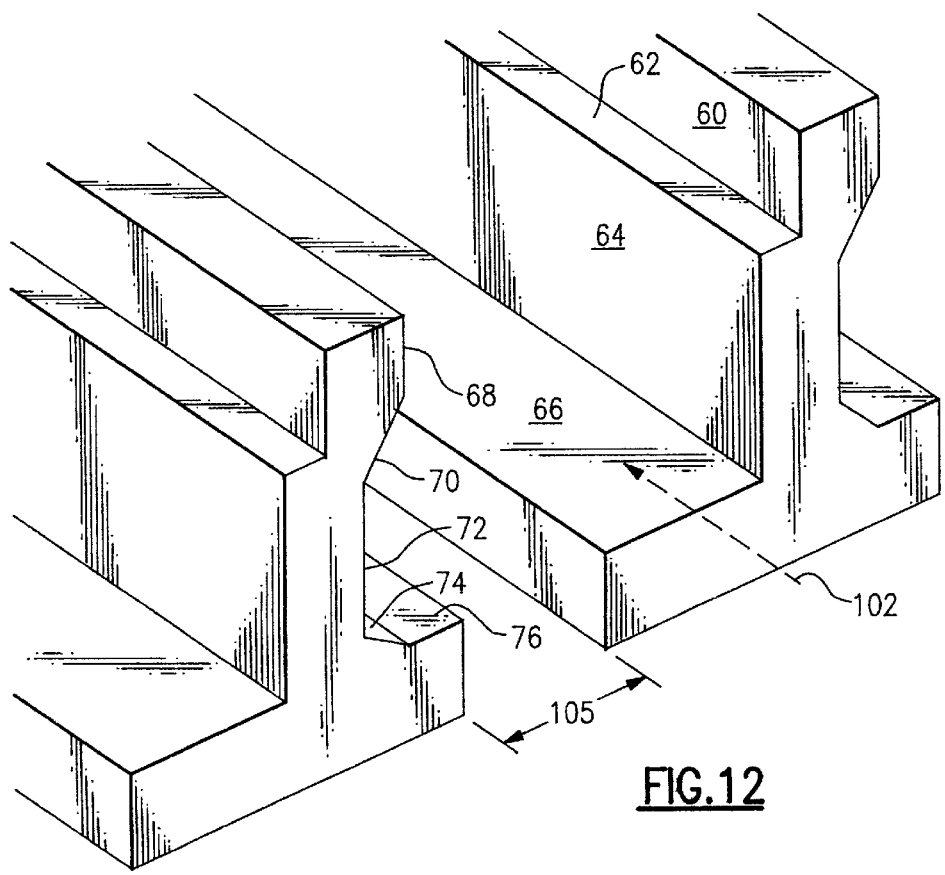
FIG. 12 is an enlarged view of a receiving area defined by the securement members of FIGS. 5–6 in a facing spaced relationship as shown in FIG. 1.

As illustrated in FIGS. 1 and 12, once engagement members 52 of securement members 28 are fixedly secured within openings 16 of mounting cover 12, securement members 28 are positioned to define a receiving area 102. Flanking first sidewall 68 and first slanted sidewall 70 of securement members 28 are in a facing spaced relationship with first sidewall 60 of the opposing securement members 28. Flanking second sidewall 68 of securement members 28 are in a facing spaced relationship with a portion of first sidewall 60 as well as longitudinal shoulder 62 and second sidewall 64 of the opposing securement members 28. Flanking second sidewall 74 and second slanted sidewall 76 of securement members 28 are in a facing spaced relationship with a second sidewall 64 of another securement members 28. Securement members 28 define a receiving area 102 having the configuration illustrated in FIG. 12.

Figure 13:
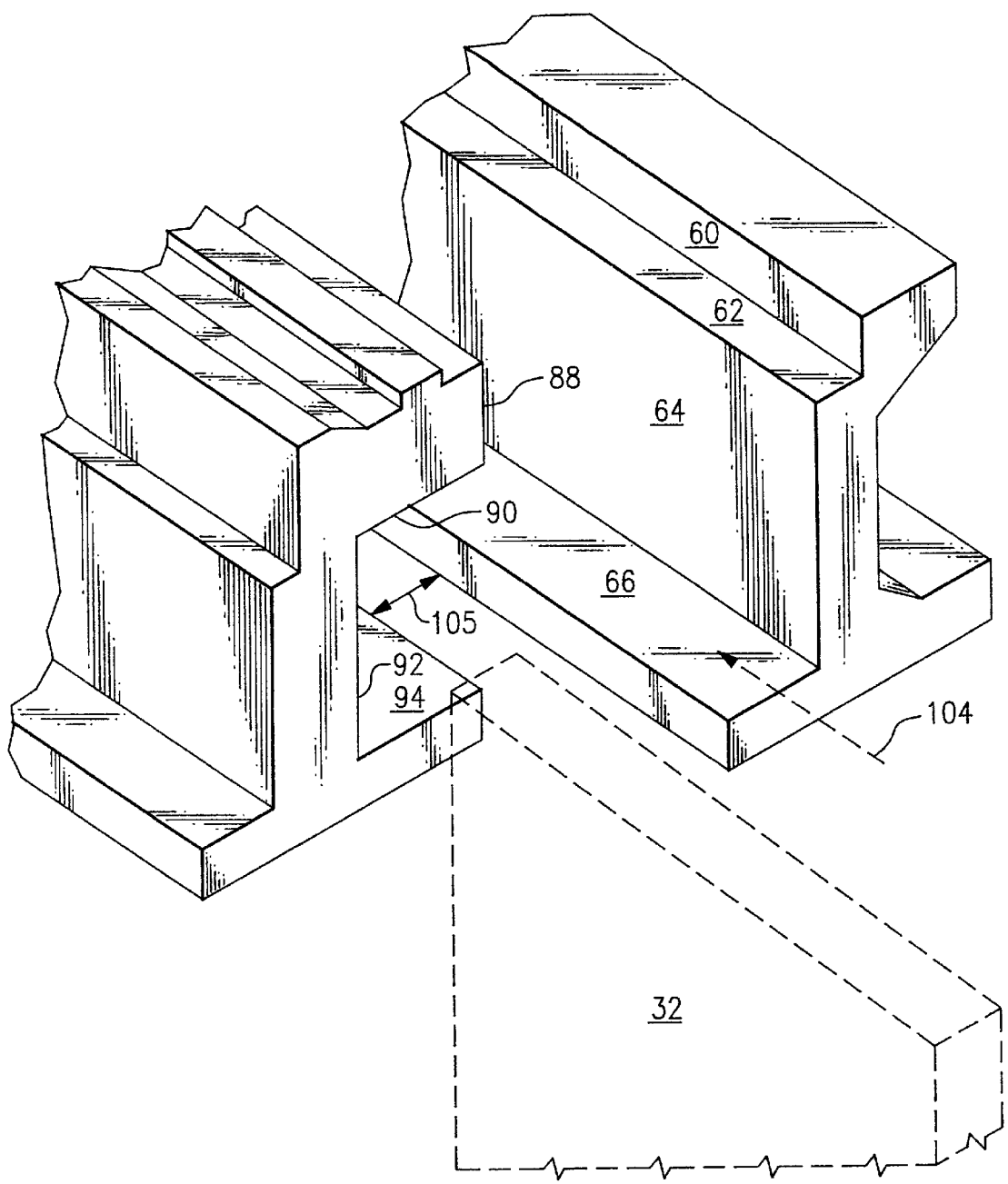
FIG. 13 is an enlarged view of a receiving area defined by the securement member of FIG. 5 and the securement member of FIG. 7.

As illustrated in FIGS. 1 and 13, once securement member 30 is fixedly secured to mounting cover 12, securement member 28 and securement member 30 are positioned to define a receiving area 104 when engagement members 52 are fixedly engaged within openings 16 and 17, respectively. Flanking first sidewall 88 and an upper portion of flanking second sidewall 92 of securement member 30 are in a facing spaced relationship with first sidewall 60 and second sidewall 64 of securement member 28 (FIG. 13). The rest of flanking second sidewall 92 of securement member 30 is in a facing spaced relationship with second sidewall 64 of securement member 28 (FIG. 13).

Securement member 30 has an area defined by ceiling 90, flanking second sidewall 92 and base portion 94 which is considerably larger in size than an area defined by first slanted sidewall 70, flanking second sidewall 72, second slanted sidewall 74 and base portion 76 of securement member 28. Securement member 30 is also wider than securement member 28; however, securement member 30 is shorter in length than securement member 28. Securement member 30 has a larger area, a greater width and a shorter length because it is located behind partition 32. Securement member 30 must be wider then partition 32 so that securement member 30 can define a receiving area 104. Securement member 28 and securement member 30 define a receiving area 104 having the configuration illustrated in FIG. 13.

Again referring to FIGS. 12–13, securement members 28 are configured to define a plurality of openings 105 in between each base surface portions 66, 76 of first securement member 28 and base surface portions 86, 94 of second securement members 30.

Figure 14:
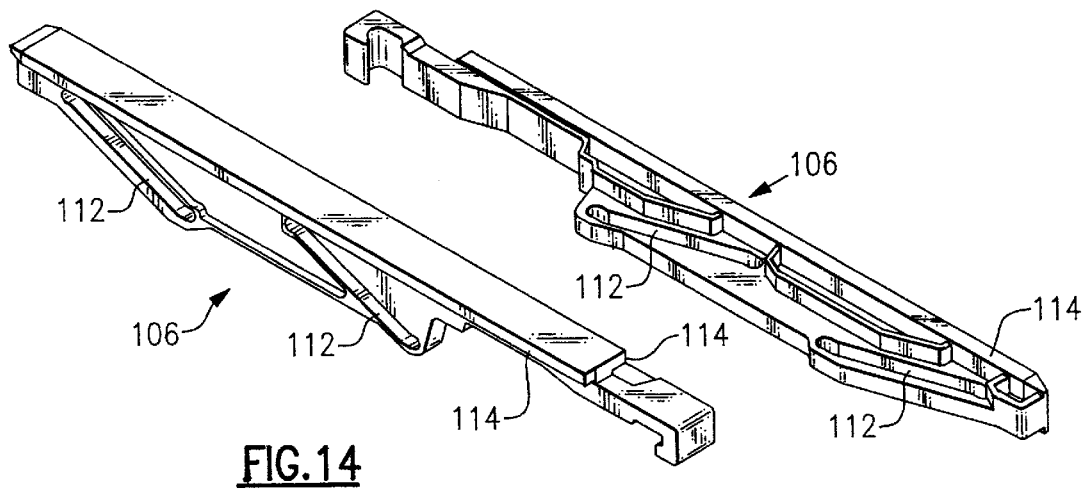
FIG. 14 depicts two side views of an actuator.
Figure 15:
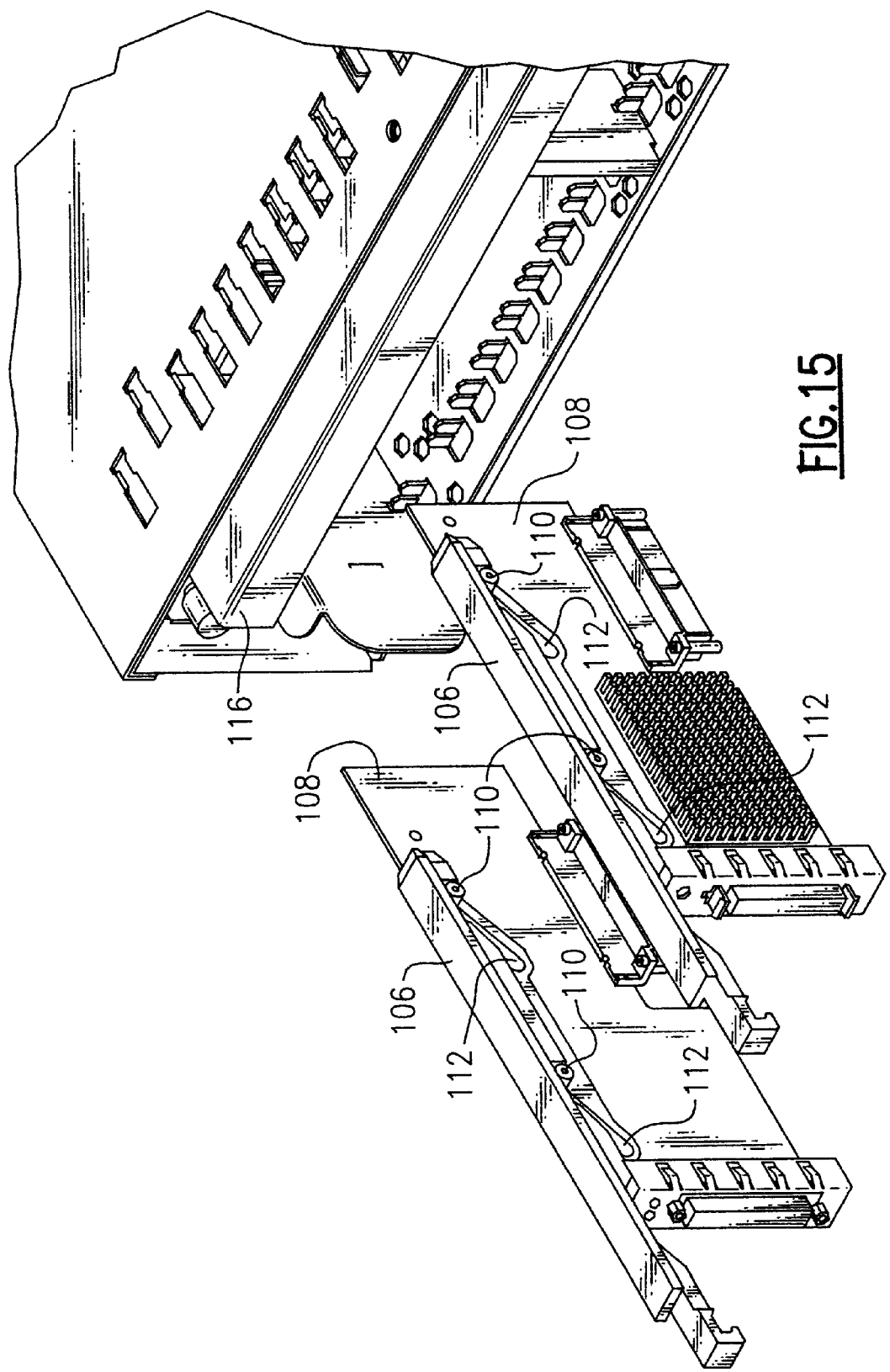
FIG. 15 depicts an actuator containing a blank plastic card and an actuator electronic interposer card, respectively.

Referring now to FIGS. 14–15, receiving areas 102, 104 define a geometry specific to a card carrier. Such a card carrier preferably is an actuator 106 containing a card 108. Actuator 106 is molded plastic and fastened to card 108 using shoulder screws 110 located in opposing slots 112 found on actuator 106 (FIG. 14). This allows actuator 106 to move independently of card 108. Card 108 can encompass any type of electronic interposer card having different functions such as wrapping signals generated from circuitry to fiber optics. Additionally, card 108 can also be a "blank", which is a plastic card used to occupy a space (FIG. 15). Actuator 106 is laterally inserted into receiving areas 102, 104. Actuator 106 is guided by a shoulder 114 located on either side of actuator 106. Opposing shoulders 114 are supported by first sidewall 60, longitudinal shoulder 62, second sidewall 64 and base portion surface 66 of securement member 28 and engages flanking first sidewall 68 of opposing securement member 28.

Once card 108 reaches an interface mechanism (not shown), shoulder screws 110 of actuator 106 are automatically aligned with cut-outs 53 of securement members 28 and securement member 30. At this point card 108 can no longer move forward in either receiving area 102 or 104. Actuator 106 is then pushed forward causing card 108 to slide at an angle within opposing slots 112. Card 108 moves downward in a vertical direction. Card 108 then mates blind with interface mechanism in a camming action as actuator 106 reaches the end of slots 112. Card 108 is now fastened flush to chassis When actuator 106 is laterally inserted into receiving area 104, actuator 106 is again guided by opposing shoulders 114, which is supported by base portion 94 of securement member 30 and engages first sidewall 60, longitudinal shoulder 62 second sidewall 64 and base portion 66 of opposing securement member 28. Both actuator 106 and card 108 engage receiving area 104 and interfacing mechanism, respectively, in the same manner as when laterally inserted into receiving area 102. In this preferred embodiment of the present invention, once actuator 106 and card 108 are laterally inserted into receiving areas 102 and 104, a retaining bar 116 is fixedly attached to the end of cards 108 and edge 27 of cover 12. The retaining bar 116 shields electromagnetic emissions emanating from the operation of the electronic equipment and prevents mounting structure 10 from becoming conductive.

Figure 16:
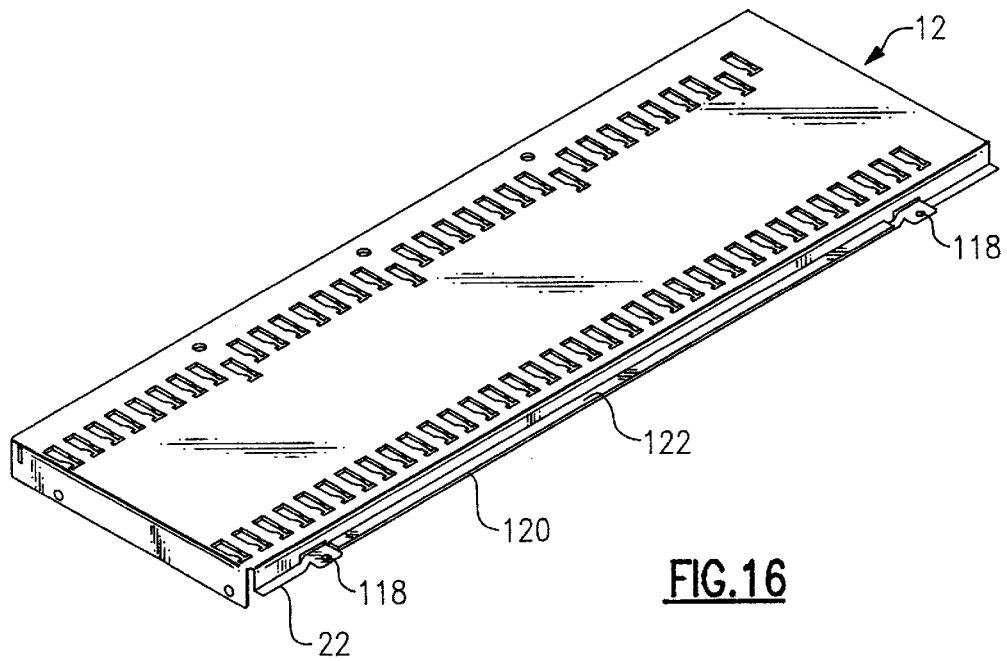
FIG. 16 is an alternative embodiment of the mounting cover.

Referring now to FIG. 16, as contemplated and in accordance with the present invention, an alternative embodiment of cover 12 can further include an end portion 22 having a pair of apertures 118 and a flange 120, which extends outwardly from end portion 22. A gasket 122 is mounted to the top of flange 120 by an adhesive found on gasket 122. In this alternative embodiment, gasket 122 is an emc gasket available from Parker Chromerics. Gasket 122 seals electromagnetic emissions emitted from the printed circuit board. Pair of apertures 118 are adapted to receive a screw or similar securement means to secure a separate cover placed upon chassis 26 to complete the enclosure and ensure correct air flow.

Accordingly, and as contemplated in accordance with the present invention, a mounting structure scalable in size for fastening objects flush to a surface, large or miniature, may be configured to receive various guidance mechanisms having different geometries. Therefore, the present invention provides a most economical and spatially conservative means for fastening objects flush to a surface.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention may not be limited to the particular embodiment disclosed as the best mode contemplated for carrying out this invention, but that the invention will include all embodiments falling within the scope of the appended claims.

What is claimed is:

1. A method of securing an object flush to a surface of a planar member, comprising:
    inserting an engagement member of said object into an opening in said planar member, said insertion of said engagement member causing said engagement member to move in a first direction and remains at or below said surface;
    repositioning said engagement member of said object in said opening, said repositioning causes said engagement member to be moved in a second direction, said second direction repositioning said engagement member in said opening, and said engagement member remains at or below said surface; and
    applying an engaging force to a portion of said engagement member, said engaging force being applied in a third direction, said third direction being substantially opposite to said first direction, and said engaging force causing said portion of said engagement member of said object to be secured within said opening and said engagement member being flush or below said surface.

2. The method recited in claim 1 wherein:
    said second direction being substantially orthogonal to said first direction.

3. The method recited in claim 1 wherein:
    said opening is configured to have a pair of tab portions which depend inwardly towards each other.

4. The method recited in claim 3 wherein:
said tab portions each have an engagement surface, said engagement surface making contact with said engagement member of said object.

5. The method recited in claim 4 wherein:
said engagement surface is chamferred.

6. The method recited in claim 3 wherein:
said opening includes a receiving opening, an engaging opening and a staking opening;
said receiving opening is configured to have a pair of sidewalls, said pair of sidewalls are tapered;
said staking opening and said receiving opening include a width greater than a width of said engagement members;
said engaging opening includes said tab portions.

7. The method recited in claim 1 wherein:
said object is a plurality of objects, said plurality of objects are secured to at or below said surface of said planar member, said surface of said planar member is a mounting surface of a mounting structure, said mounting surface having a plurality of openings.

8. A method of securing a plurality of objects flush to a surface of a mounting structure, comprising:
inserting a pair of engagement members of said plurality of objects through a pair of openings in said surface of said mounting structure, said insertion of said pair of engagement members causing said pair of engagement members to move in a first direction;
repositioning said pair of engagement members of said plurality objects in said pair of openings, said repositioning causes said pair of engagement members to be moved in a second direction, said second direction being substantially orthogonal to said first direction; and
applying an engaging force to said plurality of objects, said engaging force being applied in a third direction, said third direction being substantially opposite said first direction, and said engaging force causing said pair of engagement members of said plurality of objects to be secured within said pair of openings and said pair of engagement members being flush with said surface of said mounting structure;
said plurality of objects are at least one securement member, said securement member secured to said surface of said mounting structure, said securement member having said pair of engagement members, said pair of engagement members each having an upper surface and a pair of sidewalls, said sidewalls of said pair of engagement members being fixedly secured within said pair of openings in said surface of said mounting structure whereby said upper surface of said pair of engagement members are flush with said surface of said mounting structure;
said pair of openings are configured to have a pair of tab portions which depend inwardly towards each other, said tab portions each have an engagement surface, said engagement surface making contact with said pair of engagement members of said plurality of objects, said engagement surfaces are chamferred, said pair of openings include a receiving opening, an engaging opening and a staking opening, said engaging opening includes said tab portions.

9. A method of securing a plurality of objects flush to a surface of a mounting structure, comprising:
inserting an engagement member of said plurality of objects through a plurality of openings in said surface of said mounting structure, said insertion of said engagement member causing said engagement member to move in a first direction;
repositioning said engagement member of said plurality objects in said plurality of openings, said repositioning causes said engagement member to be moved in a second direction, said second direction being substantially orthogonal to said first direction;
applying an engaging force to said plurality of objects, said engaging force being applied in a third direction, said third direction being substantially opposite said first direction, and said engaging force causing said engagement member of said plurality of objects to be secured within said plurality of openings and said engagement member being flush with said surface of said mounting structure;
said plurality of objects are at least one securement member, said securement member having an engagement member, said engagement member is a pair of engagement members securing said securement member in said plurality of openings in said surface of said mounting structure, said pair of engagement members each having an upper surface and a pair of sidewalls, said sidewalls of said pair of engagement members being fixedly secured within said plurality of openings in said surface of said mounting structure whereby said upper surface of said engagement members are flush with said surface of said mounting structure;
said plurality of openings are configured to have a pair of tab portions which depend inwardly towards each other, said tab portions each have an engagement surface, said engagement surface making contact with said pair of engagement members of said at least one securement member, said engagement surfaces are chamferred, said plurality of openings include a receiving opening, an engaging opening and a staking opening, said engaging opening includes said tab portions.

10. A method of securing an object flush to a surface, comprising:
inserting a portion of said object through an opening in said surface, said insertion of said portion causing said object to move in a first direction;
repositioning said portion of said object in said opening, said repositioning causes said portion to be moved in a second direction, said second direction being substantially orthogonal to said first direction;
applying an engaging force to said portion of said object, said engaging force being applied in a third direction, said third direction being substantially opposite to said first direction, and said engaging force causing said portion of said object to be secured within said opening and said portion of said object being flush with said surface; and
said opening having a first portion and a second portion, said first portion being larger than said portion of said object, said second portion being smaller than said portion of said object.

11. The method recited in claim 10 wherein:
said opening is configured to have a pair of tab portions which depend inwardly towards each other.

12. The method recited in claim 11 wherein:
said tab portions each have an engagement surface, said engagement surface making contact with said portion of said object.

13. The method recited in claim 12 wherein:
said engagement surface is chamferred.

14. The method recited in claim 11 wherein:
said opening includes a receiving opening, an engaging opening and a staking opening;
said receiving opening is configured to have at least one pair of sidewalls, said pair of sidewalls are tapered;
said staking opening and said receiving opening include a width greater than a width of said portion of said object;
said engaging opening includes said tab portions; said engaging opening includes a width, said width of said engaging opening being smaller than a width of said portion of said object.

15. The method recited in claim 10 wherein:
said object is a plurality of objects, said plurality of objects are a plurality of securement members, said securement members are secured to said surface, said surface is a mounting surface of a mounting structure, said mounting surface having a plurality of openings.

* * * * *